United States Patent
Afzali-Ardakani et al.

(10) Patent No.: US 10,832,775 B1
(45) Date of Patent: Nov. 10, 2020

(54) CROSS-POINT ARRAY OF POLYMER JUNCTIONS WITH INDIVIDUALLY-PROGRAMMED CONDUCTANCES THAT CAN BE RESET

(71) Applicant: International Business Machines Corporation, Armonk, NY (US)

(72) Inventors: Ali Afzali-Ardakani, Ossining, NY (US); James B. Hannon, Lake Lincolndale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/515,442

(22) Filed: Jul. 18, 2019

(51) Int. Cl.
    *G11C 13/00*     (2006.01)
    *H01L 27/28*     (2006.01)
    *H01L 51/10*     (2006.01)
    *H01L 51/00*     (2006.01)
    *H01L 51/05*     (2006.01)

(52) U.S. Cl.
    CPC ........ *G11C 13/0097* (2013.01); *G11C 13/004* (2013.01); *G11C 13/0016* (2013.01); *G11C 13/0069* (2013.01); *H01L 27/285* (2013.01); *H01L 51/0015* (2013.01); *H01L 51/0591* (2013.01); *H01L 51/10* (2013.01); *H01L 51/005* (2013.01); *H01L 51/0035* (2013.01); *H01L 51/0071* (2013.01); *H01L 51/0072* (2013.01)

(58) Field of Classification Search
    CPC ...... G11C 13/041; G11C 13/04; G11C 13/042
See application file for complete search history.

(56) References Cited

U.S. PATENT DOCUMENTS

| | | | |
|---|---|---|---|
| 6,208,553 B1 | 3/2001 | Gryko et al. | |
| 6,756,296 B2 | 6/2004 | Heath et al. | |
| 7,175,961 B2 | 2/2007 | Beck et al. | |
| 7,714,438 B2 | 5/2010 | Zhang et al. | |
| 8,385,101 B2 | 2/2013 | Yang et al. | |
| 8,415,652 B2 | 4/2013 | Yang et al. | |
| 8,436,340 B2 | 5/2013 | Napolitano et al. | |
| 2003/0227793 A1* | 12/2003 | Tsujioka | B82Y 10/00 365/155 |
| 2006/0160251 A1 | 7/2006 | Dyreklev et al. | |
| 2009/0010040 A1* | 1/2009 | Takase | G11C 13/00 365/148 |

(Continued)

OTHER PUBLICATIONS

Sun et al., "Solving matrix equations in one step with cross-point resistive arrays," PNAS March, vol. 116, No. 10, pp. 4123-4128 (Mar. 2019).

(Continued)

*Primary Examiner* — Han Yang
(74) *Attorney, Agent, or Firm* — Anthony Curro; Michael J. Chang, LLC (57) ABSTRACT

Memory devices are provided having a cross-point array of polymer junctions with individually-programmed conductances that can be reset. In one aspect, a memory device is provided. The memory device includes: bottom metal lines; top metal lines; and polymer junctions in between the bottom metal lines and the top metal lines, wherein the polymer junctions include an organic polymer doped with a spiropyran and an acid. A method of forming and a method of operating the memory device are also provided.

18 Claims, 8 Drawing Sheets

(56) References Cited

U.S. PATENT DOCUMENTS

2015/0340634 A1* 11/2015 Forrest .............. H01L 51/4253
                                                    136/255
2017/0089128 A1* 3/2017 Wheeler ................ G02F 1/163
2019/0156094 A1* 5/2019 Du .......................... G02B 5/23

OTHER PUBLICATIONS

Yongfang Li (Ed), Organic Optoelectronic Materials, Chapter 2, Conducting Polymers, 2.6.2 Electrochemical Properties of Conducting Polyaniline, Springer International Publishing, pp. 23, 39 (2015).
Xia et al., "Advances in Spiropyrans/Spirooxazines and Applications Based on Fluorescence Resonance Energy Transfer (FRET) with Fluorescent Materials," Molecules, 22, 2236 (Dec. 2017) (16 pages).
Blinova et al., "Control of polyaniline conductivity and contact angles by partial protonation," Polymer International, vol. 57, issue 1, Abstract (May 2007) (1 page).
Guo et al., "Reversible Photoregulation of the Electrical Conductivity of Spiropyran-Doped Polyaniline for Information Recording and Nondestructive Processing," Adv. Mater. Apr. 2004, 16, No. 7, pp. 636-640.
Raoul Schroeder et al., "All-Organic Permanent Memory Transistor Using an Amorphous, Spin-Cast Ferroelectric-like Gate Insulator," Advanced Materials, vol. 16, No. 7, Apr. 2004, pp. 633-636.
T. Gokmen et al., "Acceleration of Deep Neural Network Training with Resistive Cross-Point Devices: Design Considerations," Frontiers in Neuroscience, vol. 10, Article 333, Jul. 2016 (13 pages).
T. Gokmen et al., "Acceleration of Deep Neural Network Training with Resistive Cross-Point Devices: Design Considerations," Frontiers in Neuroscience, vol. 10, Article 333, July 2016 (13 pages).

* cited by examiner

CROSS-POINT ARRAY OF POLYMER JUNCTIONS WITH INDIVIDUALLY-PROGRAMMED CONDUCTANCES THAT CAN BE RESET

FIELD OF THE INVENTION

The present invention relates to memory devices, and more particularly, to memory devices having a cross-point array of polymer junctions with individually-programmed conductances that can be reset.

BACKGROUND OF THE INVENTION

Cross-point resistive memory devices can be used to perform matrix-vector multiplication operations in one step with Ohm's law and Kirchoff's law. Resistive memory devices (also termed "memory resistors" or "memristors") store data based on the device's electrical resistance.

The resistive random access memory (ReRAM) and phase change memory (PCM) technologies currently being explored for resistive cross-point arrays, however, involve complex fabrication processes which can result in low yield. Thus, these devices are both expensive and time-consuming to implement, especially in large-scale. Further, in some instances, the resistance can only be set once, thus making such devices unsuitable for applications requiring reprogramming, so-called "learning applications."

Accordingly, improved cross-point resistive memory devices with conductance that can be reset and techniques for fabrication thereof would be desirable.

SUMMARY OF THE INVENTION

The present invention provides memory devices having a cross-point array of polymer junctions with individually-programmed conductances that can be reset. In one aspect of the invention, a memory device is provided. The memory device includes: bottom metal lines; top metal lines; and polymer junctions in between the bottom metal lines and the top metal lines, wherein the polymer junctions include an organic polymer doped with a spiropyran and an acid.

In another aspect of the invention, a method of forming a memory device is provided. The method includes: forming bottom metal lines on a substrate; forming polymer junctions on the bottom metal lines, wherein the polymer junctions include an organic polymer doped with a spiropyran and an acid; and forming top metal lines on the polymer junctions.

In yet another aspect of the invention, a method of operating a memory device is provided. The method includes: applying a voltage bias to the memory device to program the memory device, wherein the memory device includes: bottom metal lines; top metal lines; polymer junctions in between the bottom metal lines and the top metal lines, wherein the polymer junctions include an organic polymer doped with a spiropyran and an acid, and wherein the voltage bias, applied to the memory device via the bottom metal lines, opens the spiropyran in the polymer junctions forming an electron trap which reduces a conductivity of the polymer junctions; reading a resistance value of the polymer junctions; and heating the polymer junctions to close the spiropyran to restore the conductivity of the polymer junctions.

A more complete understanding of the present invention, as well as further features and advantages of the present invention, will be obtained by reference to the following detailed description and drawings.

DETAILED DESCRIPTION OF PREFERRED EMBODIMENTS

Figure 1:
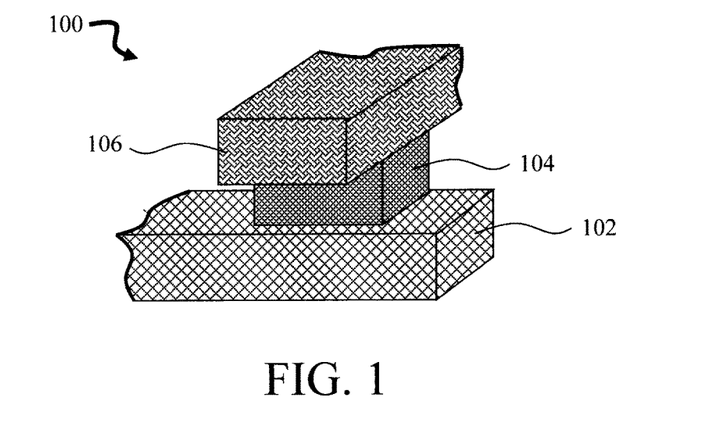
FIG. 1 is a three-dimensional diagram illustrating an exemplary resistive element having a polymer junction present between a bottom metal line and a top metal line according to an embodiment of the present invention.

Provided herein are memory devices having a cross-point array of resistive elements with individually-programmed conductances that can be reset, and techniques for fabrication thereof. Each of the resistive elements is formed by a polymer junction sandwiched between a bottom metal line and a top metal line. See, for example, FIG. 1. As shown in FIG. 1, resistive element 100 includes a polymer junction 104 present between a bottom metal line 102 and a top metal line 106, such that the bottom/top metal lines 102 and 106 run below and above the polymer junction 104, respectively. Further, as will be described in further detail below, the bottom/top metal lines 102 and 106 are oriented orthogonal to one another with a single one of the polymer junctions 104 at each intersection of the bottom/top metal lines 102 and 106, thereby forming the cross-point array. With this cross-point configuration, each resistive element can be selectively accessed (i.e., for programming/reprogramming and read-out) via the corresponding bottom and top metal lines 102 and 106.

Each polymer junction 104 is formed from an acid-doped electrically conductive organic polymer that is also doped with a reversible charged trap that can be activated by the application of a voltage bias to 'open' the trap thereby lowering the conductance of the polymer junction 104. Heating restores the trap to a closed state which has minimal impact on the polymer conductivity. Thus, by this mechanism, the conductance of the polymer junction 104 can be reset to enable reprogramming of the resistive elements within the array.

According to an exemplary embodiment, the organic polymer is polyaniline (PANI) that is made electrically conductive via proton-acid doping. Namely, PANI is electrically insulating when in its undoped Emeraldine base form, i.e., However, when exposed to an acid, protons from the acid dope the PANI forming the electrically conductive Emeraldine salt form, i.e.,

Suitable acids for doping PANI in this manner include, but are not limited to, trifluoromethane sulfonylimide, i.e., A favorable characteristic of acid doped PANI is that it can be easily de-doped by removing the proton-acid in a basic solution. As will be described in detail below, this property will be leveraged herein, via selective chemical acid de-doping, to create an array of polymer junctions from a single, continuous film of the polymer.

In one exemplary embodiment, each polymer junction 104 is formed from PANI doped with a first dopant, e.g., trifluoromethane sulfonylimide, which renders the PANI electrically conductive and a second dopant, e.g., a spiropyran, which provides a reversible charge trap. The acid dopant concentration can be used to tune the high-conductivity value of the polymer junction 104. The 'high-conductivity value' is the conductance of the polymer junction 104 based on the acid doping concentration when the charge trap is closed and has a minimal impact on the conductivity (see below). Conversely, a 'low-conductivity value' of the polymer junction 104 is the conductance of the polymer junction 104 when the charge trap is open (lowering the conductivity) (see below).

According to an exemplary embodiment, the reversible charge trap compound is a spiropyran, i.e., Spiropyrans are compounds having two heteroaromatic rings (one being a pyran ring) which are connected through an $sp^3$ hybridized spiro carbon atom.

Figure 2:
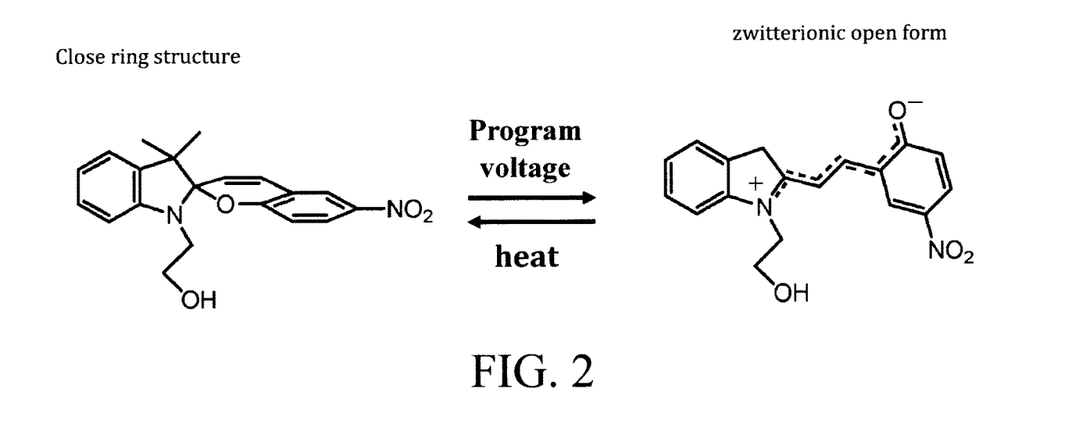
FIG. 2 is a diagram illustrating the reversible transformation between the "closed" and "open" structures of a spiropyran compound according to an embodiment of the present invention.

Advantageously, spiropyrans undergo reversible structural change upon exposure to radiation. Accordingly, spiropyrans exist in two forms. One form, shown above, is the low-energy, closed ring form. This 'closed' form of a spiropyran has minimal impact on the conductivity of the polymer junction 104. However, when the closed ring structure is subjected to a voltage bias, the spiropyran is converted to a second 'open' form—a Zwitterionic (charged) trap, i.e., This 'open' form of spiropyran reduces the conductivity of the polymer junction 104. Namely, in the 'open' form the spiropyran causes more electron scattering. The scattering of (conduction) electrons manifests itself as a higher resistance. However, heating causes the spiropyran to close (i.e., reverting back to the close ring form) thereby restoring the high conductivity. This reversible transformation between the "closed" and "open" structures of a spiropyran compound is shown in FIG. 2.

Therefore, the conductivity value, i.e., high or low, can be regulated based on the form of the spiropyran, i.e., closed or open, which can be reset via heating. By way of non-limiting example only, according to an exemplary embodiment, a high-conductivity value is from about 1 microsiemens (µS) to about 5 µS and ranges therebetween, and a low-conductivity value is from about 0.10 to about 0.60 and ranges therebetween.

Figure 3:
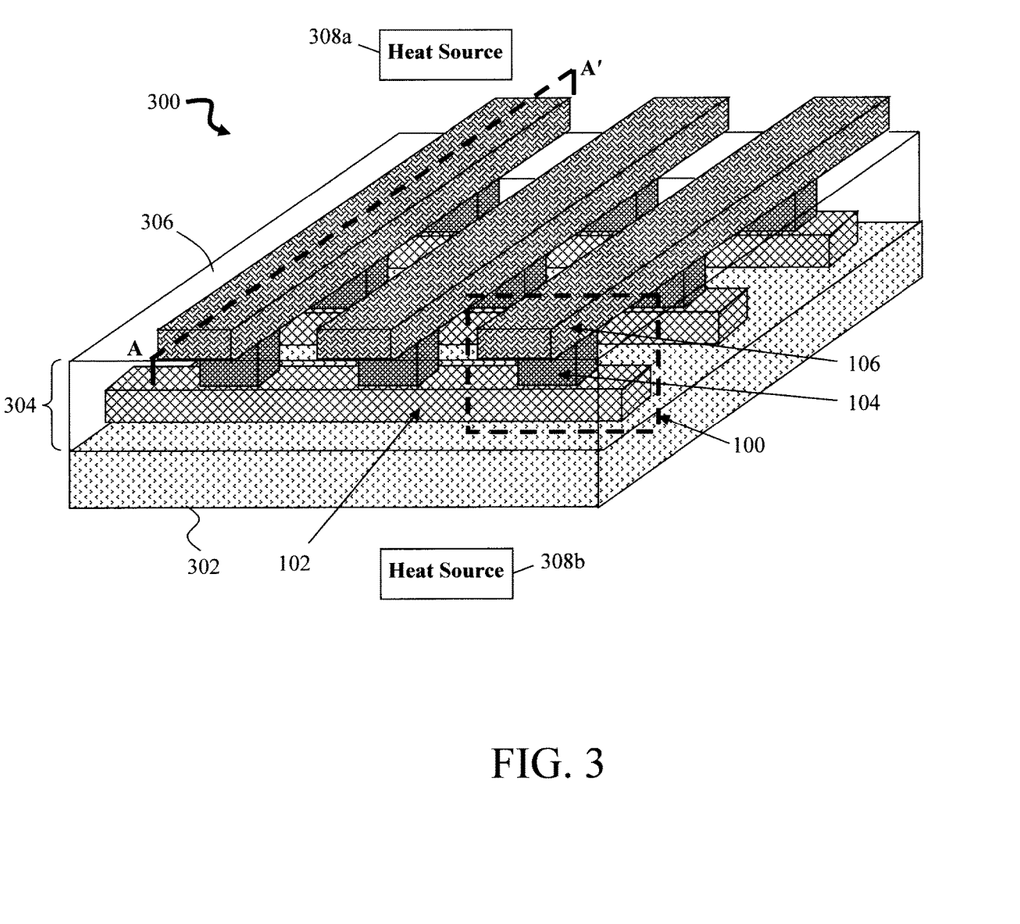
FIG. 3 is a three-dimensional diagram illustrating an exemplary memory device having a cross-point array of the resistive elements of FIG. 1 according to an embodiment of the present invention.
Figure 4:
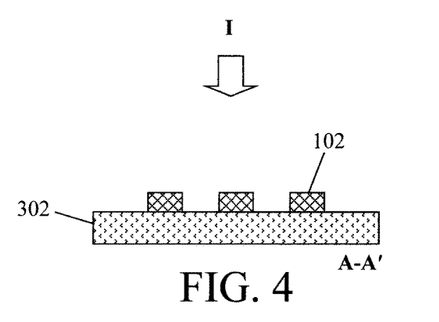
FIG. 4 is a cross-sectional diagram illustrating bottom metal lines having been formed on a substrate according to an embodiment of the present invention.

An exemplary memory device 300 having a cross-point array of resistive elements 100 is shown in FIG. 3. It is notable that like structures are numbered alike in the figures. As shown in FIG. 3, memory device 300 is formed on a substrate 302. According to an exemplary embodiment, substrate 302 is an insulating substrate. Suitable insulating substrate materials include, but are not limited to, oxide materials such as silicon oxide (SiOx) and/or silicon oxycarbide (SiOC). It is notable that, although not explicitly shown in the figures, one or more other device elements may also be present. For instance, according to an exemplary embodiment, substrate 302 is an insulating layer on a semiconductor wafer, whereby the semiconductor wafer has other device elements such as transistors, resistors, capacitors, etc. also formed thereon.

A plurality of the bottom metal lines 102 are disposed parallel to one another on substrate 302. According to an exemplary embodiment, bottom metal lines 102 are formed from a metal(s) such as, but not limited to, copper (Cu), gold (Au), nickel (Ni), platinum (Pt), palladium (Pd) and/or cobalt (Co).

The polymer junctions 104 are disposed on the bottom metal lines 102. As provided above, according to an exemplary embodiment, the polymer junctions 104 are formed from an organic polymer (e.g., PANI). The organic polymer itself is electrically insulating. However, doping with an acid (e.g., trifluoromethane sulfonylimide) makes the organic polymer electrically conductive. As described below, this characteristic can be leveraged, via selective chemical acid de-doping to create the polymer junctions 104 from a single, continuous film of the polymer without the need for physical device isolation (e.g., via reactive ion etching (RIE)). For instance, as shown in FIG. 3, polymer junctions 104 are present in a single, continuous film 304 of the polymer (e.g., acid-doped and spiropyran-doped PANI). In this configuration, portions 306 of film 304 are electrically insulating (via the acid de-doping process described below) while other portions of film 304 remain acid-doped and thus electrically conductive. It is the latter (electrically conductive portions) that forms the polymer junctions 104. Further, doping with the spiropyran enables the polymer junctions 104 to be reset between their high-conductivity value (i.e., based on the acid doping concentration when the spiropyran is in the 'closed' form) and their 'low-conductivity value' (i.e., when the spiropyran is 'opened' by an applied voltage bias which, due to electron scattering, increases resistance). Heating can be used to close the spiropyran, thus forming a reversible charge trap.

A plurality of the top metal lines 106 are disposed parallel to one another above the polymer junctions 104, such that the polymer junctions 104 are present between the bottom metal lines 102 and the top metal lines 106. Like bottom metal lines 102, top metal lines 106 can be formed from a metal(s) such as, but not limited to, Cu, Au, Ni, Pt, Pd and/or Co. As shown in FIG. 3, the top metal lines 106 are oriented orthogonal to the bottom metal lines 102, with a single one of the polymer junctions 104 at each intersection of the bottom metal lines 102 and top metal lines 106 thus forming the cross-point array. This configuration enables each of the polymer junctions 104 to be selectively accessed via the corresponding bottom and top metal lines 102 and 106.

As shown in FIG. 3, a heat source(s) 308a, 308b, etc. can be present above and/or below the cross-point array to enable heating of the acid-doped and spiropyran-doped polymer junctions 104. As provided above, when the spiropyran dopant is in the 'open' (electron trap) form, a mild heating (e.g., at a temperature of less than or equal to about 125° C., e.g., from about 100° C. to about 125° C. and ranges therebetween) can be used to close the spiropyran, restoring the high-conductivity value of the polymer junctions 104. According to an exemplary embodiment, this heating is carried out by way of heat source(s) 308a, 308b, etc. concurrently across all of the polymer junctions 104 (i.e., the entire cross-point array is heated at once). However, configurations are also contemplated herein where individual groupings of polymer junctions 104, or even individual polymer junctions 104 themselves are separately heated.

Suitable heat sources 308a, 308b, etc. include, but are not limited to, light from a laser source, full spectrum bulb, etc., a hot plate, a resistive heating element, etc. Of course, the positioning of the heat sources 308a, 308b, etc. relative to the cross-point array/polymer junctions 104 depends on the type of heat source being employed. For instance, memory device 300 can be placed directly on a hot plate and/or resistive element, whereas a light source might instead be offset from the array in order to illuminate all of the polymer junctions 104. Further, the depiction of heat sources 308a, 308b, etc. above and/or below the cross-point array is merely provided as an example, and other configurations are possible. For instance, one variant contemplated herein includes at least one heat source such as a resistive heating element integrated into the substrate 302.

As highlighted above, selective chemical acid de-doping can be used to create the polymer junctions 104 from a single, continuous film of the acid-doped and spiropyran-doped organic polymer, advantageously without the need for physical device isolation (e.g., via reactive ion etching (RIE)). An exemplary methodology for fabricating the present memory device using this technique is now described by way of reference to FIGS. 4-11. FIGS. 4-11 provide cross-sectional and top-down views of the memory device structure during the fabrication process. The cross-sectional views depict cuts along line A-A' (see FIG. 3). As provided above, like structures are numbered alike in the figures.

The process begins with the formation of bottom metal lines 102 on substrate 302. See FIG. 4. According to an exemplary embodiment, substrate 302 is an insulating substrate, e.g., an SiOx substrate, a SiOC substrate, etc.—see above. As provided above, suitable metals for bottom metal lines 102 include, but are not limited to, Cu, Au, Ni, Pt, Pd and/or Co. By way of example only, the metal(s) for bottom metal lines 102 can be deposited on substrate 302 using a process such as sputtering, evaporation or electrochemical plating, and then patterned into the individual bottom metal lines 102 using standard lithography and etching techniques. Alternatively, a lift-off process or deposition through a shadow mask can also be employed.

Figure 5:
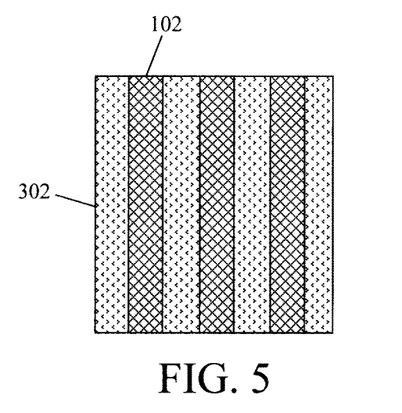
FIG. 5 is a top-down diagram illustrating the bottom metal lines having been formed on the substrate according to an embodiment of the present invention.
Figure 6:
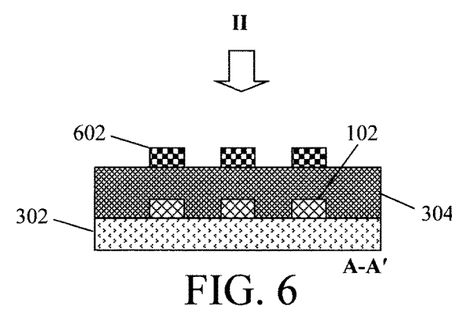
FIG. 6 is a cross-sectional diagram illustrating a single, continuous film of acid-doped, spiropyran-doped electrically conductive organic polymer having been deposited onto the substrate over the bottom metal lines, and a mask having been formed covering/masking portions of the organic polymer that will remain spiropyran and acid-doped/electrically-conductive creating the polymer junctions according to an embodiment of the present invention.

FIG. 5 is a top-down diagram (i.e., from view point I—see FIG. 4) of bottom metal lines 102 having been formed on substrate 302. As shown in FIG. 5, bottom metal lines 102 extend along a first direction (i.e., from top to bottom in the present depiction). As will be described in detail below, the top metal lines 106 will be formed extending along a second direction that is perpendicular to the first direction, such that the bottom metal lines 102 are oriented orthogonal to the top metal lines 106.

A single, continuous film of acid-doped, spiropyran-doped electrically conductive organic polymer 304' is then deposited onto substrate 302 over the bottom metal lines 102. See FIG. 6. As provided above, suitable organic polymers include, but are not limited to, PANI. Suitable acid dopants include, but are not limited to, trifluoromethane sulfonylimide. The spiropyran serves as a reversible charge trap. Namely, as described in detail above, spiropyrans exist in two forms. One is a low-energy, closed ring form which has minimal impact on the conductivity of the organic polymer 304'. The other is an 'open' form is a Zwitterionic (charged) trap which reduces the conductivity of the organic polymer 304.' Switching between the 'closed' and 'open' forms is reversible by the application of a voltage bias (to open the compound) and heating (to reset to the closed form), respectively. The result is an acid-doped, spiropyran-doped organic polymer 304' having reprogrammable conductivity.

According to an exemplary embodiment, PANI (emeraldine base) powder (commercially available, e.g., from Sigma-Aldrich, St. Louis, Mo.) is mixed with an acid (e.g., trifluoromethane sulfonylimide) in a solvent (such as water) to form a (aqueous) solution of PANI (emeraldine salt) which is electrically conductive. As highlighted above, the acid doping concentration can be adjusted to tune the high-conductivity value of the polymer junctions. Namely, the conductivity of acid-doped polyaniline can depend on the dopant acid concentration or pH.

A spiropyran (commercially available, e.g., from Sigma-Aldrich, St. Louis, Mo.) is then added to the solution of acid-doped PANI. The conductivity of the acid-doped polymer can also depend on the amount of spiropyran added to the solution. Thus, the spiropyran doping level provides another mechanism for tuning the conductivity value of the polymer junctions.

The acid-doped and spiropyran-doped solution is then deposited onto the substrate 302 using a casting process such as spin-coating to form a single, continuous film of the electrically conductive organic polymer 304' on substrate 302 over the bottom metal lines 102. An anneal (e.g., at a temperature of from about 50° C. to about 200° C. and ranges therebetween) can be performed to remove the solvent from the film.

At this stage of the fabrication process, the entire film of acid-doped and spiropyran-doped organic polymer 304' is electrically conductive. However, as will be described in detail below, a chemical acid de-doping process will be used to remove the proton-acid in select portions 306 of the film, rendering these portions 306 of the film electrically insulating. Elsewhere, the film remains electrically conductive. The result is the formation of electrically conductive portions of the film (which correspond to the polymer junctions 104) separated from one another by the electrically insulating portions 306 of the film. Advantageously, this process permits the creation of polymer junctions 104 from a single, continuous film of the organic polymer 304' without the need for physical device isolation (e.g., via RIE).

To enable the acid de-doping of select portions of the organic polymer 304', a mask 602 is next formed covering/masking the portions of the organic polymer 304' that will not receive the acid de-doping treatment. See FIG. 6. To look at it another way, mask 602 covers the portions of the organic polymer 304' that will remain spiropyran and acid-doped/electrically-conductive creating the polymer junctions 104. It is notable that the acid de-doping treatment of the unmasked portions (i.e., portions 306) does not necessarily have an effect on the spiropyran. For instance, portions 306 of the film remain spiropyran-doped. However, since these portions 306 of the film are rendered electrically insulating by the acid de-doping process, the presence of the spiropyran is inconsequential.

Preferably, the mask 602 is formed from an electrically conductive material, e.g., a metal(s) such as Cu, Au, Ni, Pt, Pd and/or Co. That way, the mask 602 will be self-aligned with the polymer junctions 104 and, following chemical acid de-doping, the top metal lines 106 can simply be formed over the mask 602. According to an exemplary embodiment, the metal is deposited using a process such as sputtering, evaporation or electrochemical plating, and then patterned into the mask 602 using standard lithography and etching techniques. Alternatively, a lift-off process or deposition through a shadow mask can also be employed.

Figure 7:
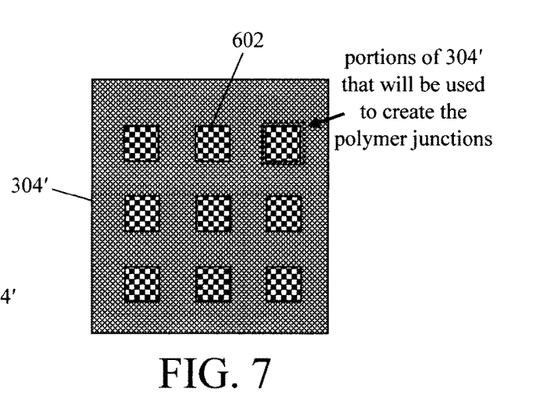
FIG. 7 is a top-down diagram illustrating the mask having been formed on the film of acid-doped, spiropyran-doped electrically conductive organic polymer according to an embodiment of the present invention.

FIG. 7 is a top-down diagram (i.e., from view point II—see FIG. 6) of the mask 602 formed on the film of the organic polymer 304'. As shown in FIG. 7, mask 602 covers the portions of the layer of organic polymer 304' that will be used to create the polymer junctions 104, whereas everywhere else the organic polymer 304' will be chemically de-doped.

Figure 8:
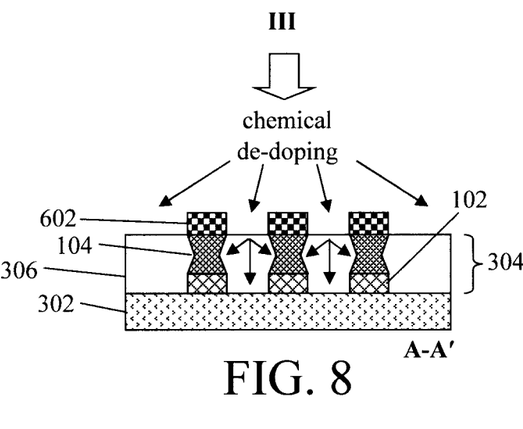
FIG. 8 is a cross-sectional diagram illustrating chemical acid de-doping having been used to remove the proton-acid in the organic polymer creating electrically insulating portions of the film of organic polymer outside of the mask according to an embodiment of the present invention.

As shown in FIG. 8, chemical acid de-doping is then used to remove the proton-acid in the organic polymer 304'. According to an exemplary embodiment, this process is carried out by contacting the film of organic polymer 304' with a base to remove the proton-acid. Namely, as provided above, the organic polymer is electrically insulating and it is the protons from the acid dopant that make the polymer electrically conductive. Removing the proton-acid will, in turn, have the opposite effect of making the polymer electrically insulating. As provided above, the acid de-doping treatment does not necessarily have an effect on the spiropyran. For instance, following chemical acid de-doping, portions 306 of the film remain spiropyran-doped. However, since these portions 306 of the film are rendered electrically insulating by the acid de-doping process, the presence of the spiropyran is inconsequential. Mask 602, however, will prevent the treatment of those portions of the organic polymer 304' directly beneath the mask 602. Those (i.e., first) portions of the film of organic polymer covered by mask 602 form the polymer junctions 104, whereas the remaining (i.e., second) portions 306 of the film of organic polymer are rendered electrically insulating via the acid de-doping process.

Suitable bases for chemical acid de-doping include, but are not limited to, sodium carbonate ($Na_2CO_3$), ammonia ($NH_3$) and/or alkali metal hydroxides. For instance, according to an exemplary embodiment, organic polymer 304' is contacted with an aqueous solution of $Na_2CO_3$ by dipping the device structure into the $Na_2CO_3$ solution. Alternatively, the $Na_2CO_3$ solution can be sprayed or otherwise cast onto the device structure.

Following acid de-doping treatment, the film of organic polymer is given the reference numeral 304. As shown in FIG. 8, the film of organic polymer 304 has first (electrically conductive) portions beneath the mask 602 that correspond to the polymer junctions 104, and second (electrically insulating) portions 306 in between the polymer junctions 104. Notably, both first/electrically conductive (acid-doped) and second/electrically insulating (chemically acid-de-doped) portions exist in the same film of (spiropyran-doped) organic polymer 304.

When the film of organic polymer is contacted with the $Na_2CO_3$ solution (e.g., dipped, sprayed, etc.), the $Na_2CO_3$ solution will have access to the exposed areas of the film not blocked by mask 602 and bottom metal lines 102. As the solution permeates the film it moves laterally and vertically through the film, giving the polymer junctions 104 created in organic polymer 304 an hourglass cross-sectional shape between the mask 602 and bottom metal lines 102. See FIG. 8. However, what is important is that each of the polymer junctions 104 provides an electrically conductive pathway between the mask 602/top metal lines 106 (to be formed as described below) above the polymer junctions 104 and the bottom metal lines 102 below the polymer junctions 104.

Figure 9:
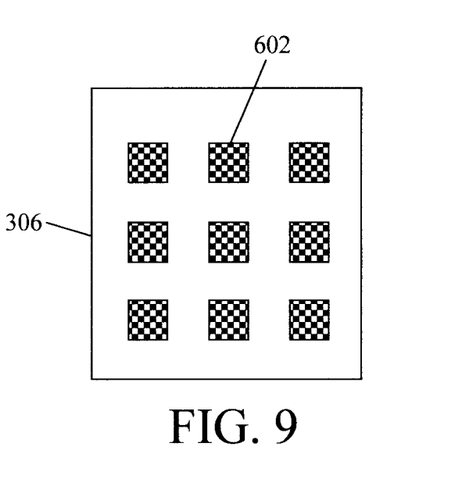
FIG. 9 is a top-down diagram illustrating electrically insulating portions of the film of organic polymer having been created outside of the mask by the chemical acid de-doping according to an embodiment of the present invention.

FIG. 9 is a top-down diagram (i.e., from view point III—see FIG. 8) illustrating the (electrically insulating) portions 306 of the film of organic polymer 304 created by the chemical acid de-doping process outside of mask 602. While not visible in this top-down depiction, portions of the film of organic polymer 304 beneath mask 602 serve as the (electrically conductive) acid- and spiropyran-doped polymer junctions 104.

Top metal lines 106 are then formed on the film of organic polymer 304 over, and in contact with, the mask 602. See FIG. 10. Since the mask 602 is self-aligned with the polymer junctions 104 via the chemical acid de-doping process (see above) and is preferably formed from an electrically conductive material, top metal lines 106 can access the polymer junctions 104 through the mask 602. Forming the top metal lines 106 over the mask 602 produces a unique metal structure over the polymer junctions 104, whereby the top metal lines 106 have a raised topography wherever they pass over the mask 602. As provided above, suitable metals for the top metal lines 106 include, but are not limited to, Cu, Au, Ni, Pt, Pd and/or Co. The metal(s) for top metal lines 106 can be deposited using a process such as sputtering, evaporation or electrochemical plating, and then patterned into the individual top metal lines 106 using standard lithography and etching techniques. Alternatively, a lift-off process or deposition through a shadow mask can also be employed.

Figure 10:
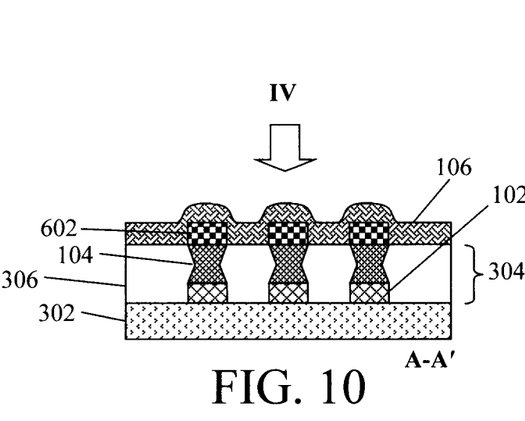
FIG. 10 is a cross-sectional diagram illustrating top metal lines having been formed on the film of organic polymer over, and in contact with, the mask according to an embodiment of the present invention.

As shown in FIG. 10, the bottom metal lines 102 and the top metal lines 106 run below and above the polymer junctions 104, respectively. Further, as highlighted above, the bottom metal lines 102 are oriented orthogonal to the top metal lines 106 such that a single polymer junction 104 is present at each intersection of the bottom and top metal lines 102 and 106.

Figure 11:
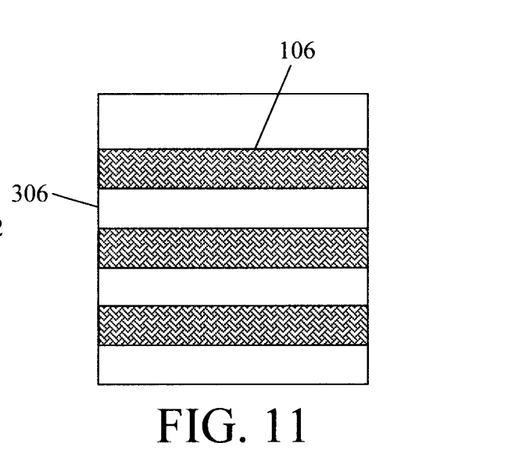
FIG. 11 is a top-down diagram illustrating the top metal lines having been formed on the film of organic polymer over the mask according to an embodiment of the present invention.

FIG. 11 is a top-down diagram (i.e., from view point IV—see FIG. 10) illustrating the top metal lines 106 formed on the film of organic polymer 304 over the mask 602 (such that the mask 602 is not visible in this top-down depiction). As shown in FIG. 11, top metal lines 106 extend along a second direction (i.e., from left to right in the present depiction). As described above, the bottom metal lines 102 extend along a first direction that is perpendicular to the second direction, such that the bottom metal lines 102 are oriented orthogonal to the top metal lines 106.

While the use of chemical acid de-doping provides an easy and effective process for forming the polymer junctions 104, i.e., without the need for physical device isolation, it is notable that the present techniques should not be construed as being limited to any fabrication process in particular. For instance, one could instead employ a lithography and etching process to pattern the polymer junctions 104 from an acid- and polyaniline-doped film of the polymer.

Figure 12:
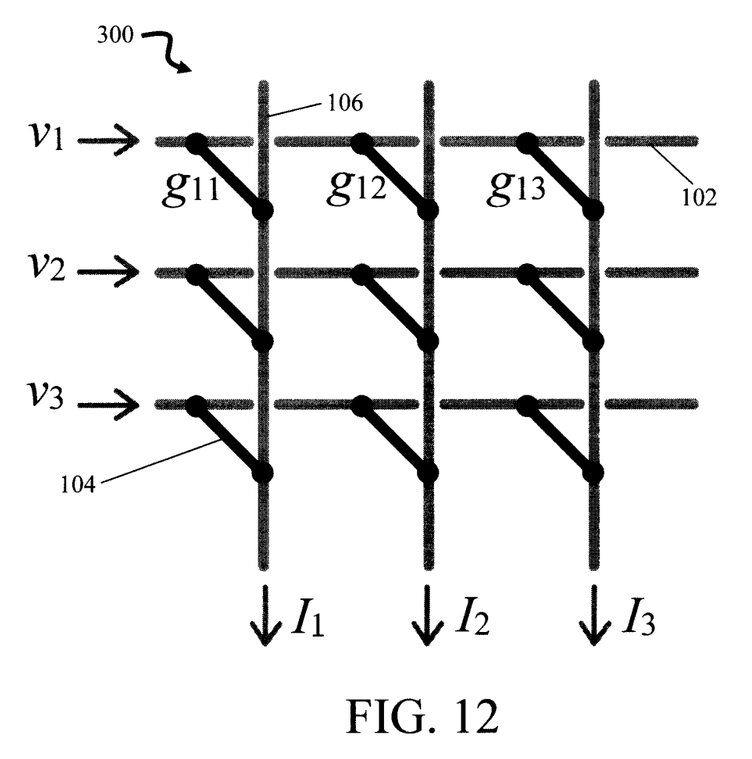
FIG. 12 is a schematic diagram of the present memory device according to an embodiment of the present invention.
Figure 13:
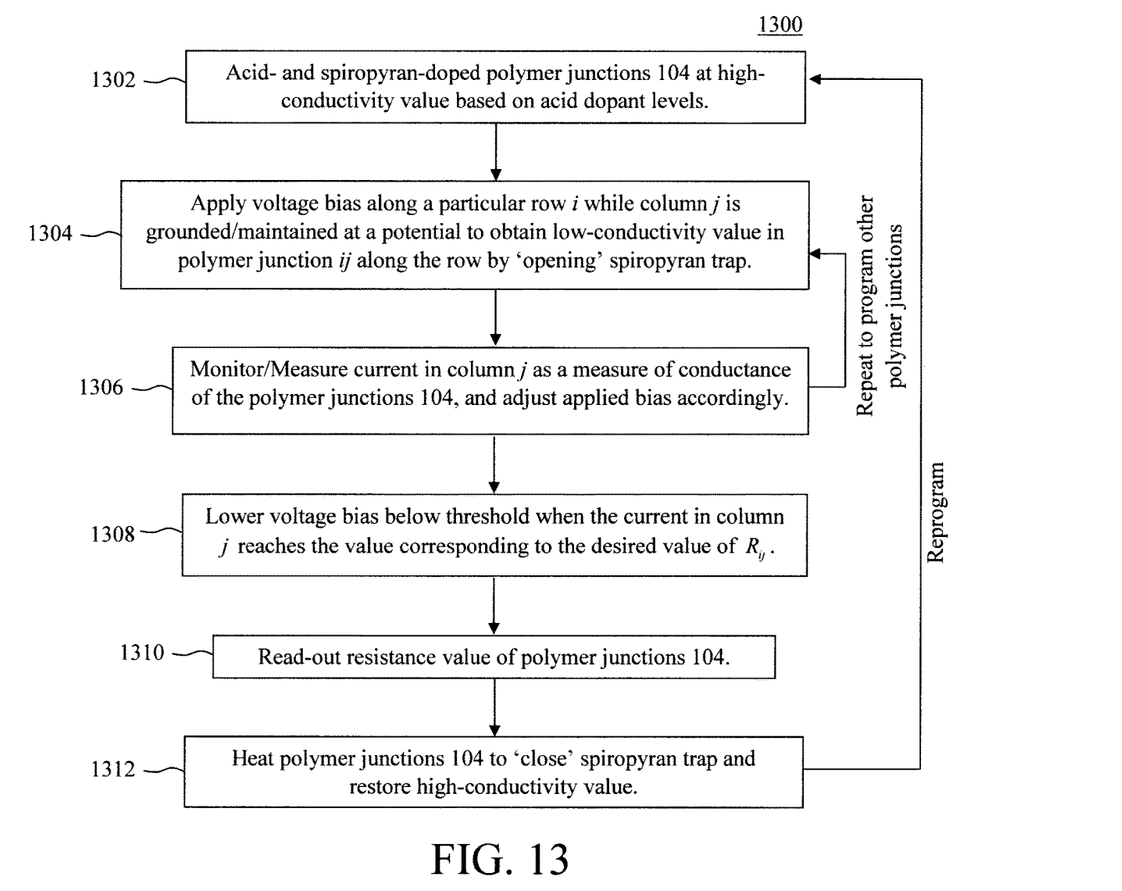
FIG. 13 is a diagram illustrating an exemplary methodology for operating the memory device of FIG. 12 according to an embodiment of the present invention.
Figure 14:
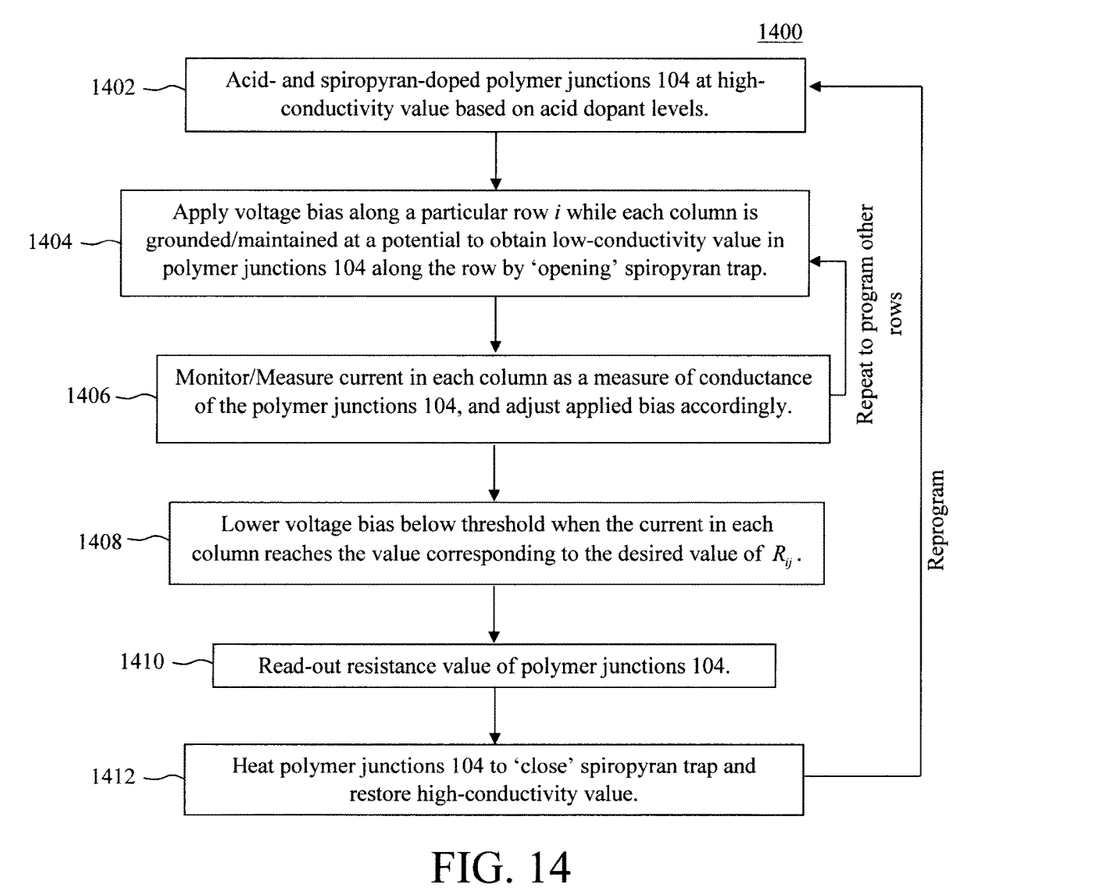
FIG. 14 is a diagram illustrating another exemplary methodology for operating the memory device of FIG. 12 according to an embodiment of the present invention.

Operation of the present memory device 300 is now described by way of reference to FIGS. 12-14. FIG. 12 is a schematic diagram of memory device 300 which, as described above, includes bottom metal lines 102 oriented orthogonal to top metal lines 106. A polymer junction 104 is present in between each intersection of the bottom and top metal lines 102 and 106, forming the cross-point array shown in FIG. 12. In this two-dimensional illustration, the bottom metal lines 102 are arranged in a series of rows i below the polymer junction 104, whereas the top metal lines 106 are arranged as a series of columns j above the polymer junction 104.

As shown in FIG. 12, each polymer junction 104 is uniquely identified using the designation $g_{row,\ column}$, with row corresponding to a particular row/bottom metal line 102 and column corresponding to a particular column/top metal line 106 of the cross-point array. For instance, each polymer junction 104 along row 1 of the array has the designation $g_{\{1,\ column\}}$, with the polymer junction 104 at the intersection with the top metal line 106 at column 1 designated as $g_{11}$, the polymer junction 104 at the intersection with the top metal line 106 at column 2 designated as $g_{12}$, and so on.

An exemplary methodology 1300 for operating memory device 300 is provided in FIG. 13. The process begins in step 1302 with memory device 300 having the cross-point array polymer junctions 104 (e.g., PANI) that, as described above, are acid—(e.g., trifluoromethane sulfonylimide) and spiropyran-doped. At this stage, the spiropyran is in the 'closed' form which, as described above, has a minimal impact on the conductivity of the polymer junctions 104. In that case, the conductance of the polymer junction 104 (i.e., the 'high-conductivity value'—see above) is based on the acid doping concentration, which can be used to tune the conductivity.

Generally, programming of memory device 300 will be accomplished by applying a voltage bias via the bottom/top metal lines 102/106 to change (i.e., increase) the resistance $R_{ij}$ of the polymer junctions 104. This resistance change occurs with an applied voltage above a threshold. This threshold can be measured for a given device layout and polymer formulation. For instance, by way of example only, the conductance of the polymer junctions can be measured as the applied voltage is slowly increased. Up to a certain point, the conductance will actually increase with the applied bias. However, if the applied bias is large enough, the conductance will start to go down. This is the threshold. Having this voltage threshold for device programming enables programming of individual polymer junctions 104 in memory device 300 without the need for selector devices at each junction. In general, the programming scheme ensures that only the polymer junction or junctions 104 that is/are to be programmed have an applied bias that is larger than the threshold. Specifically, the bias applied to a polymer junction ij, that is, between row i and column j is given by $|V_i - V_j|$ where $V_i$ is the voltage applied to row i and $V_j$ is the voltage applied to column j. The voltage bias of all other polymer junctions must be lower than the threshold.

To program the polymer junction ij in the i-th row and j-th column of memory device 300, a programming voltage bias is applied to a particular one of the bottom metal lines 102 along row i, while a particular one of the top metal lines 106 along column j is grounded (or maintained at a potential such that the applied voltage to polymer junction ij is greater than the threshold). See step 1304. This voltage bias applied in step 1304 is used to open the spiropyran forming electron traps to program the low-conductivity value. As described above, the 'open' form of the spiropyran causes more electron scattering, which manifests itself as a higher resistance/lower conductance.

Only a low voltage applied voltage bias is needed in step 1304 to 'open' the spiropyran. For instance, according to an exemplary embodiment, a magnitude of the voltage applied in step 1304 is from about 1 volt (V) to about 5V and ranges therebetween. Notably, it has been found herein that higher voltages (e.g., 10V and above) will remove the proton-acid, irreversibly decreasing the conductance of the polymer junctions 104, whereas lower voltages (e.g., less than about 5V) will not. While not being bound by any particular theory, it is thought that higher voltages cause proton-acid leaving, polymer restructuring, polymer cross-linking and/or changes to the contact/polymer interface. The voltage bias can be applied as a continuous voltage to row i or as a series of discreet voltage pulses. Applying a low-voltage to the polymer junctions 104 initially opens a fraction of the spiropyran dopants, leading to lower conductance. With a continuous applied voltage, more of the spiropyran dopants will open over time further decreasing the conductance. Alternatively, according to another exemplary embodiment, voltage pulses having a duration of from about 0.5 seconds (s) to about 1.5 s and ranges therebetween are employed. Further, in one exemplary embodiment, the voltage pulses are of a uniform magnitude and duration, e.g., each voltage pulse is is at 5V.

In step 1306, the current in column j is monitored continuously as a measure of the conductance of polymer junction ij. With an applied bias above the threshold, the current in column j will decrease with time as the resistance of polymer junction ij (i.e., $R_{ij}$) increases. If need be, the applied bias can be adjusted accordingly. For instance, if no current decrease in column j is detected in step 1306, then an increase in the applied bias might be needed to reach the threshold.

When the current in column j reaches the value corresponding to the desired value of $R_{ij}$ (meaning that the polymer junctions 104 have been programmed), the voltage bias applied to polymer junction ij is lowered below the threshold (e.g., by raising a voltage applied to column j). See step 1308. As shown in FIG. 13, the process is then repeated to program another polymer junction, and so on, until all of the polymer junctions 104 of memory device 300 are programmed.

Once programmed, the resistance values of each of the polymer junctions 104 in the array can be read simply by applying a lower value read voltage to a given row (via the corresponding bottom metal line 102) and measuring the output current at the intersecting column (via the corresponding top metal lines 106). See step 1310. For instance, if a read voltage is applied to the first row of the array, the output current measured at the first column is the resistance value of the polymer junction 104 ($g_{11}$). The read voltage has to be lower than the programming voltage in order to prevent altering (i.e., increasing) the value of the polymer junctions 104. For instance, according to an exemplary embodiment, the read voltage employed in step 1310 is from about 0.5 V to about 0.8 V and ranges therebetween.

The polymer junctions 104 store their low-conductivity value until the spiropyran dopant is reset to the 'closed' form by heating. Resetting the spiropyran dopant to the 'closed' form restores the high-conductivity value, allowing the polymer junctions 104 to be reprogrammed. Notably, the conductivity imparted by the acid dopant is generally unaffected by this programming and reprogramming process.

In step 1312, the polymer junctions 104 are reset to their high-conductivity value (erasing the stored value) by heating the polymer junctions 104 to a temperature T sufficient to close the spiropyran dopants. As described above, the closed form of the spiropyran has a minimal impact on the conductivity. Hence, closing the spiropyran dopant restores the high conductance. According to an exemplary embodiment, T is less than or equal to about 125° C., e.g., from about 100° C. to about 125° C. and ranges therebetween. Suitable heat source(s) 308a, 308b, etc. were provided above. As also provided above, heating is preferably carried out concurrently across all of the polymer junctions 104 (i.e., the entire cross-point array is heated at once). However, configurations are also contemplated herein where individual groupings of polymer junctions 104, or even individual polymer junctions 104 themselves are separately heated. As shown in FIG. 13, once reset by the heating, the steps of methodology 1300 can be repeated to reprogram the polymer junctions 104.

A similar process can be implemented for programming all of the polymer junctions 104 in a given row (e.g., row i). See, for example, exemplary methodology 1400 of FIG. 14.

As above, the process begins in step 1402 with memory device 300 having the cross-point array polymer junctions 104 (e.g., PANI) that, as described above, are acid—(e.g., trifluoromethane sulfonylimide) and spiropyran-doped. At this stage, the spiropyran is in the 'closed' form which, as described above, has a minimal impact on the conductivity of the polymer junctions 104. In that case, the conductance of the polymer junction 104 (i.e., the 'high-conductivity value'—see above) is based on the acid doping concentration, which can be used to tune the conductivity.

To program all of the polymer junctions in row i of memory device 300, a programming voltage bias is applied to a particular one of the bottom metal lines 102 along row i, while all of the top metal lines 106 along each of the columns is grounded (or maintained at a potential such that the applied voltage to polymer junctions in row i is greater than the threshold). See step 1404. This voltage bias applied in step 1404 is used to open the spiropyran forming electron traps to program the low-conductivity value. As described above, the 'open' form of the spiropyran causes more electron scattering, which manifests itself as a higher resistance/lower conductance.

Only a low voltage applied voltage bias is needed in step 1404 to 'open' the spiropyran. For instance, according to an exemplary embodiment, a magnitude of the voltage applied in step 1404 is from about 1 V to about 5V and ranges therebetween. The voltage bias can be applied as a continuous voltage to row i or as a series of discreet voltage pulses.

In step 1406, the current in column j is monitored continuously as a measure of the conductance of the corresponding polymer junction in row i. As above, with an applied bias above the threshold, the current in column will decrease with time as the resistance of the corresponding polymer junction in row i (i.e., $R_{ij}$) increases. If need be, the applied bias can be adjusted accordingly. For instance, if no current decrease in the columns is detected in step 1406, then an increase in the applied bias might be needed to reach the threshold.

When the current in each column reaches the value corresponding to the desired value of $R_{ij}$ (meaning that the corresponding polymer junctions in row i have been programmed), the voltage bias applied to that corresponding polymer junction is lowered below the threshold (e.g., by raising a voltage applied to the corresponding column). See step 1408. This process is carried out in parallel for all of the polymer junctions in row i. As shown in FIG. 14, the process is then repeated to program the polymer junctions in another row of memory device 300, and so on, until all of the polymer junctions 104 of memory device 300 are programmed.

Once programmed, the resistance values of each of the polymer junctions 104 in the array are read by applying a lower value read voltage to a given row (via the corresponding bottom metal line 102) and measuring the output current at the intersecting column (via the corresponding top metal lines 106). See step 1410. For instance, if a read voltage is applied to the first row of the array, the output current measured at the first column is the resistance value of the polymer junction 104 ($g_{11}$). The read voltage has to be lower than the programming voltage in order to prevent altering (i.e., increasing) the value of the polymer junctions 104. For instance, according to an exemplary embodiment, the read voltage employed in step 1410 is from about 0.5 V to about 0.8 V and ranges therebetween.

In step 1412, the polymer junctions 104 are reset to their high-conductivity value (erasing the stored value) by heating the polymer junctions 104 to a temperature T sufficient to close the spiropyran dopants. As described above, the closed form of the spiropyran has a minimal impact on the conductivity. Hence, closing the spiropyran dopant restores the high conductance. According to an exemplary embodiment, T is less than or equal to about 125° C., e.g., from about 100° C. to about 125° C. and ranges therebetween. Suitable heat source(s) 308*a*, 308*b*, etc. were provided above. As also provided above, heating is preferably carried out concurrently across all of the polymer junctions 104 (i.e., the entire cross-point array is heated at once). However, configurations are also contemplated herein where individual groupings of polymer junctions 104, or even individual polymer junctions 104 themselves are separately heated. As shown in FIG. 14, once reset by the heating, the steps of methodology 1400 can be repeated to reprogram the polymer junctions 104.

Figure 15:
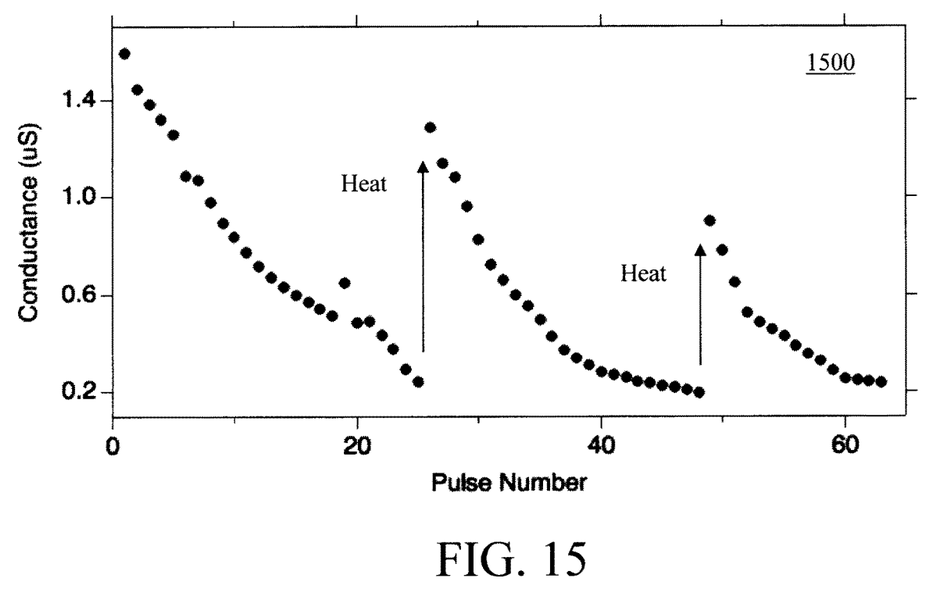
FIG. 15 is a diagram illustrating programming/reprogramming of the polymer junctions via a series of voltage pulses to open the spiropyran dopant, in between which a reset is performed using heating to close the spiropyran dopant and restore high-conductivity according to an embodiment of the present invention.

As provided above, programming/reprogramming of the polymer junctions 104 can be achieved via a series of voltage pulses to open the spiropyran dopant. In between, a reset is performed using heating to close the spiropyran dopant and restore the high-conductivity value. This process is further illustrated in FIG. 15. As shown in FIG. 15, each voltage pulse (in this case 1 s at 5V) causes an incremental decrease in conductance of the polymer junctions 104. For instance, in this example, 25 voltage pulses successively lower the conductance from about 1.6 µS to about 0.3 µS. Heating partially restores the conductance, enabling the polymer junctions 104 to be reprogrammed using a series of (in this case 23) voltage pulses. Again, heating is performed to reset the value, and so on.

Figure 16:
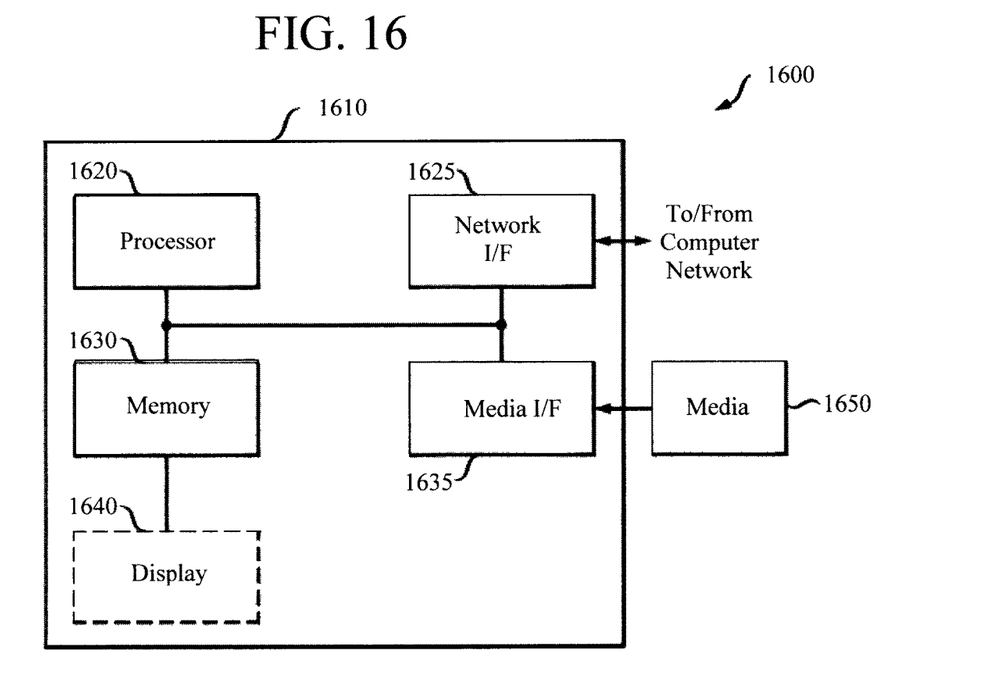
FIG. 16 is a diagram illustrating an exemplary apparatus according to an embodiment of the present invention.

The present memory devices can be included in and/or operated in conjunction with an apparatus such as apparatus 1600 of FIG. 16. As shown in FIG. 16, apparatus 1600 includes a computer system 1610 and removable media 1650. Computer system 1610 includes a processor device 1620, a network interface 1625, a memory 1630, a media interface 1635 and an optional display 1640. Network interface 1625 allows computer system 1610 to connect to a network, while media interface 1635 allows computer system 1610 to interact with media, such as a hard drive or removable media 1650.

Processor device 1620 can be configured to implement the methods, steps, and functions disclosed herein. The memory 1630 could be distributed or local and the processor device 1620 could be distributed or singular. The memory 1630 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1620. With this definition, information on a network, accessible through network interface 1625, is still within memory 1630 because the processor device 1620 can retrieve the information from the network. It should be noted that each distributed processor that makes up processor device 1620 generally contains its own addressable memory space. It should also be noted that some or all of computer system 1610 can be incorporated into an application-specific or general-use integrated circuit.

Optional display 1640 is any type of display suitable for interacting with a human user of apparatus 1600. Generally, display 1640 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A memory device, comprising:
   bottom metal lines;
   top metal lines; and
   polymer junctions in between the bottom metal lines and the top metal lines, wherein the polymer junctions comprise an organic polymer doped with a spiropyran and an acid, wherein the acid comprises trifluoromethane sulfonylimide.

2. The memory device of claim 1, wherein the bottom metal lines are oriented orthogonal to the top metal lines, and wherein one of the polymer junctions is located at each intersection of the bottom metal lines and the top metal lines thereby forming a cross-point array.

3. The memory device of claim 2, further comprising at least one heat source positioned at least one of above and below the cross-point array.

4. The memory device of claim 1, wherein the organic polymer comprises polyaniline.

5. The memory device of claim 1, further comprising:
   a substrate on which the bottom metal lines, the top metal lines and the polymer junctions are disposed.

6. The memory device of claim 5, wherein the substrate comprises a material selected from the group consisting of: silicon oxide (SiOx), silicon oxycarbide (SiOC), and combinations thereof.

7. The memory device of claim 1, further comprising:
   a continuous film of the organic polymer disposed over the bottom metal lines, wherein first portions of the film are electrically conductive and correspond to the polymer junctions, and wherein other second portions of the film are electrically insulating.

8. The memory device of claim 7, further comprising:
   a mask disposed on the film that covers the first portions of the film that are electrically conductive, wherein the mask is aligned with the polymer junctions.

9. The memory device of claim 8, wherein the mask is electrically conductive and comprises a metal selected from the group consisting of: copper (Cu), gold (Au), nickel (Ni), platinum (Pt), palladium (Pd), cobalt (Co) and combinations thereof.

10. The memory device of claim 8, wherein the top metal lines are formed over the mask.

11. A method of forming a memory device, the method comprising the steps of:
    forming bottom metal lines on a substrate;
    forming polymer junctions on the bottom metal lines, wherein the polymer junctions comprise an organic polymer doped with a spiropyran and an acid; and
    forming top metal lines on the polymer junctions, wherein the method further comprises the steps of:
    depositing a continuous film of the organic polymer doped with the spiropyran and the acid onto the substrate over the bottom metal lines;

forming a mask on the film that covers first portions of the film and leaves other second portions of the film exposed; and de-doping the second portions of the film to remove the acid making the second portions of the film electrically insulating, wherein the first portions of the film are electrically conductive and correspond to the polymer junctions, and wherein the mask is aligned with the polymer junctions.

12. The method of claim 11, wherein the de-doping step comprises the step of:

contacting the film with a solution comprising a base.

13. The method of claim 12, wherein the base comprises sodium carbonate ($Na_2CO_3$).

14. The method of claim 11, wherein the mask is electrically conductive, and wherein the top metal lines are formed on the polymer junctions over the mask.

15. A method of operating a memory device, the method comprising the steps of:

applying a voltage bias to the memory device to program the memory device, wherein the memory device comprises:

bottom metal lines;

top metal lines;

polymer junctions in between the bottom metal lines and the top metal lines, wherein the polymer junctions comprise an organic polymer doped with a spiropyran and an acid, and wherein the voltage bias, applied to the memory device via the bottom metal lines, opens the spiropyran in the polymer junctions forming an electron trap which reduces a conductivity of the polymer junctions;

reading a resistance value of the polymer junctions; and heating the polymer junctions to close the spiropyran to restore the conductivity of the polymer junctions.

16. The method of claim 15, wherein the voltage bias is applied continuously to the memory device, the method further comprising the step of:

monitoring a current via the top metal lines while continuously applying the voltage bias to determine when the conductivity of the polymer junctions reaches a desired value.

17. The method of claim 15, wherein the voltage bias is applied as a series of voltage pulses to the memory device, the method further comprising the step of:

measuring a current via the top metal lines after each voltage pulse is applied to determine when the conductivity of the polymer junctions reaches a desired value.

18. The method of claim 15, further comprising the step of:

repeating the applying step to reprogram the memory device after the conductivity of the polymer junctions has been restored by the heating step.

* * * * *